(12) United States Patent
Wang et al.

(10) Patent No.: US 10,614,768 B2
(45) Date of Patent: Apr. 7, 2020

(54) SHIFT REGISTER, GATE INTEGRATED DRIVING CIRCUIT, AND DISPLAY APPARATUS

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Hui Wang, Beijing (CN); Jian Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

(*) Notice: Subject to any disclaimer, the term of this patent is extended or adjusted under 35 U.S.C. 154(b) by 245 days.

(21) Appl. No.: 15/574,359

(22) PCT Filed: Mar. 10, 2017

(86) PCT No.: PCT/CN2017/076255
§ 371 (c)(1),
(2) Date: Nov. 15, 2017

(87) PCT Pub. No.: WO2018/028195
PCT Pub. Date: Feb. 15, 2018

(65) Prior Publication Data
US 2018/0233099 A1 Aug. 16, 2018

(30) Foreign Application Priority Data
Aug. 12, 2016 (CN) .......................... 2016 1 0665879

(51) Int. Cl.
*G09G 3/36* (2006.01)
*G11C 19/28* (2006.01)

(52) U.S. Cl.
CPC ......... *G09G 3/3677* (2013.01); *G11C 19/287* (2013.01); *G09G 2230/00* (2013.01);
(Continued)

(58) Field of Classification Search
CPC ............... G09G 3/3674; G09G 3/3677; G09G 2230/00; G09G 2300/0408;
(Continued)

(56) References Cited

U.S. PATENT DOCUMENTS 9,275,589 B2 * 3/2016 Hu ..................... G09G 3/3655
9,305,498 B2 * 4/2016 Wang .................. G09G 3/3677
(Continued)

FOREIGN PATENT DOCUMENTS

CN     101127199 A     2/2008
CN     102012591 A     4/2011
(Continued)

OTHER PUBLICATIONS

Office Action dated Jun. 3, 2019, issued in counterpart Chinese Application No. 201610665879.0, with English translation (18 pages).
(Continued)

*Primary Examiner* — Patrick O Neill
(74) *Attorney, Agent, or Firm* — Westerman, Hattori, Daniels & Adrian, LLP

(57) ABSTRACT

A shift register for a display device. The shift register may include a shift register processing circuit (10) and a control circuit (20). A first terminal of the control circuit (20) may be coupled to an output terminal (Qn) of the shift register processing circuit (10), a second terminal of the control circuit (20) may be coupled to an output terminal of the shift register (Output), and a third terminal of the control circuit (20) may be coupled to a control signal terminal (T0). The shift register may be configured to output a final gate line
(Continued)

scan signal from the output terminal of the shift register (Output), and a starting point of the final gate line scan signal is later than a starting point of a gate line scan signal outputted from the output terminal (Qn) of the shift register processing circuit (10).

18 Claims, 10 Drawing Sheets

(52) U.S. Cl.
CPC .............. *G09G 2300/0408* (2013.01); *G09G 2310/0286* (2013.01); *G09G 2310/0291* (2013.01); *G09G 2310/08* (2013.01); *G09G 2320/0209* (2013.01)

(58) Field of Classification Search
CPC ... G09G 2310/0286; G09G 2310/0291; G09G 2310/06; G09G 2310/08; G09G 2320/0209; G11C 19/28; G11C 19/287
See application file for complete search history.

(56) References Cited

U.S. PATENT DOCUMENTS

| | | | | |
|---|---|---|---|---|
| 9,336,898 B2* | 5/2016 | Kong | ................... | G09G 3/3674 |
| 9,524,665 B2* | 12/2016 | Peng | ................... | G09G 3/3674 |
| 9,563,396 B2* | 2/2017 | Huang | ...................... | G06F 5/01 |
| 9,589,666 B2 | 3/2017 | Zheng et al. | | |
| 10,095,058 B2* | 10/2018 | Wang | ................... | G02F 1/13306 |
| 10,283,038 B2* | 5/2019 | Zhou | ........................ | G09G 3/20 |
| 2012/0249518 A1 | 10/2012 | Won et al. | | |
| 2012/0293466 A1 | 11/2012 | Jeong et al. | | |
| 2015/0187433 A1* | 7/2015 | Zheng | ...................... | G09G 3/20 345/207 |
| 2017/0018243 A1 | 1/2017 | Huang et al. | | |

FOREIGN PATENT DOCUMENTS

| | | |
|---|---|---|
| CN | 102682699 A | 9/2012 |
| CN | 102881248 A | 1/2013 |
| CN | 103065578 A | 4/2013 |
| CN | 103927958 A | 7/2014 |
| CN | 104700803 A | 6/2015 |
| CN | 106023949 A | 10/2016 |
| KR | 20080022719 A | 3/2008 |

OTHER PUBLICATIONS

Office Action dated Dec. 3, 2018, issued in counterpart Chinese Application No. 201610665879.0, with English machine translation. (21 pages).

Office Action dated Mar. 2, 2018, in counterpart Chinese Application No. 201610665879.0, (9 pages).

International Search Report dated Jun. 13, 2017, issued in counterpart International Application No. PCT/CN2017/076255 (13 pages).

Office Action dated Oct. 8, 2019, issued in counterpart CN application No. 201610665879.0, with English translation. (24 pages).

* cited by examiner

Prior Art

SHIFT REGISTER, GATE INTEGRATED DRIVING CIRCUIT, AND DISPLAY APPARATUS

CROSS-REFERENCE TO RELATED APPLICATIONS

This application claims the benefit of the filing date of Chinese Patent Application No. 201610665879.0 filed on Aug. 12, 2016, the disclosure of which is hereby incorporated by reference.

TECHNICAL FIELD

This invention relates to a display technology, and more particularly, to a shift register, a gate integrated driving circuit, and a display apparatus.

BACKGROUND

With non-display area of a liquid crystal display panel is getting narrower, the traditional LCD display panel driver architecture has been unable to meet current needs. Therefore, GOA (Gate on array) technology came into being. GOA is a technology integrating a gate driving circuit onto a thin film transistor (TFT) substrate, which supplies a gate driving signal to a gate of each thin film transistor in a pixel region through the gate driving circuit. Therefore, comparing to driving technology of conventional liquid crystal display panels, GOA not only reduces bonding area of the gate driving circuit and fan-out (fan-out) wiring space of the gate driving circuit, but also achieves a narrow border design, which makes it possible to design narrower and narrower non-display areas. However, with the large-size of display panel, another problem arises, that is, crosstalk occurs between adjacent gate lines.

BRIEF SUMMARY

Accordingly, one example of the present disclosure is a shift register. The shift register may comprise a shift register processing circuit and a control circuit. A first terminal of the control circuit may be coupled to an output terminal of the shift register processing circuit. A second terminal of the control circuit may be coupled to an output terminal of the shift register. A third terminal of the control circuit may be coupled to a control signal terminal. The shift register may be configured to output a final gate line scan signal from the output terminal of the shift register. A starting point of the final gate line scan signal may be later than a starting point of a gate line scan signal outputted from the output terminal of the shift register processing circuit. In one embodiment, the control circuit may be configured to output the gate line scan signal outputted from the output terminal of the shift register processing circuit to the output terminal of the shift register under a control of the control signal terminal. A timing of the final gate line scan signal may overlap with a timing of the gate line scan signal, and a time period of the final gate line scan signal may be shorter than that of the gate line scan signal. A timing of an effective control signal of the control signal terminal may overlap with a timing of the gate line scan signal, and a time period of the effective control signal may be shorter than that of the gate line scan signal.

The control circuit may comprise a first thin film transistor. A gate of the first thin film transistor may be coupled to the control signal terminal. A source of the first thin film transistor may be coupled to the output terminal of the shift register processing circuit. A drain of the first thin film transistor may be coupled to the output terminal of the shift register.

The shift register may further comprise a filter circuit. The filter circuit may be coupled between the output terminal of the shift register processing circuit and the first terminal of the control circuit. The filter circuit may be configured to eliminate noise in the gate line scanning signal outputted from the output terminal of the shift register processing circuit, and then output the gate line scanning signal to the first terminal of the control circuit.

The filter circuit may comprise a second thin film transistor. A gate and a source of the second thin film transistor may be coupled to the output terminal of the shift register processing circuit respectively. A drain of the second thin film transistor may be coupled to the first terminal of the control circuit.

The shift register may further comprise a first reset circuit. A first terminal of the first reset circuit may be coupled to the output terminal of the shift register. A second terminal of the first rest circuit may be coupled to a reference signal terminal. A third terminal of the first reset circuit may be coupled to a reset signal terminal. The reset signal terminal may be coupled to an output terminal of a shift register processing circuit of a next stage shift register. The first reset circuit may be configured to supply a reference signal of the reference signal terminal to the output terminal of the shift register when a reset signal is inputted to the reset signal terminal.

The first reset circuit may comprise a third thin film transistor. A gate of the third thin film transistor may be coupled to the reset signal terminal. A source of the third thin film transistor may be coupled to the reference signal terminal. A drain of the third thin film transistor may be coupled to the output terminal of the shift register.

The shift register processing circuit may comprise an input circuit, an output circuit, a second reset circuit, and a pull-down control circuit. The input circuit may be configured to control an electric potential of the first node to be the first electric potential when an effective pulse signal is inputted to the signal input terminal. The output circuit may be configured to supply a clock signal of the first clock signal terminal to the output terminal of the shift register processing circuit when the first node is at the first electric potential. The second reset circuit may be configured to supply a reference signal of the reference signal terminal to the first node and the output terminal of the shift register processing circuit when a reset signal is inputted to the reset signal terminal. The pull-down control circuit may be configured to provide a reference signal of the reference signal terminal to the first node and the output terminal of the shift register processing circuit when a clock signal is inputted to the second clock signal terminal.

A first terminal of the input circuit may be coupled to a signal input terminal. A second terminal of the input circuit may be coupled to a first node. The signal input terminal may be coupled to an output terminal of a shift register processing circuit of a previous stage shift register. A first terminal of the output circuit may be coupled to a first clock signal terminal. A second terminal of the output circuit may be coupled to the first node. A third terminal of the output circuit may be coupled to the output terminal of the shift register processing circuit. A first terminal of the second reset circuit may be coupled with the reference signal terminal. A second terminal of the second reset circuit may be coupled to the reset signal terminal. A third terminal of the second reset circuit may be coupled to the first node. A fourth terminal of the second reset circuit may be coupled to the output terminal of the shift register processing circuit. The reset signal terminal is coupled to the output terminal of the shift register processing circuit of the next stage shift register. A first terminal of the pull-down control circuit may be coupled to a second clock signal terminal. A second terminal of the pull-down control circuit may be coupled to the reference signal terminal. A third terminal of the pull-down control circuit may be coupled to the first node. A fourth terminal of the pull-down control circuit may be coupled to the signal output terminal.

The shift register processing circuit may further comprise a pull-down circuit. A first terminal of the pull-down circuit may be coupled to the second clock signal terminal. A second terminal of the pull-down circuit may be coupled to the first node. A third terminal of the pull-down circuit may be coupled to the signal input terminal. A fourth terminal of the pull-down circuit may be coupled to the reference signal terminal. A fifth terminal of the pull-down circuit may be coupled to the output terminal of the shift register processing circuit. The pull-down circuit may be configured to supply a reference signal of the reference signal terminal to the output terminal of the shift register processing circuit and turn on the signal input terminal and the first node when a clock signal is inputted to the second clock signal terminal.

Another example of the present disclosure is a gate integrated driving circuit. The gate integrated driving circuit may comprise a plurality of shift registers, which comprise a shift register according to one embodiment of the present disclosure. There may be a certain time interval between final output signals from output terminals of two adjacent shift registers to a coupled gate line.

Another example of the present disclosure is a display device comprising the gate integrated driving circuit according to one embodiment of the present disclosure.

Another example of the present disclosure is a driving method of the shift register according to one embodiment of the present disclosure. The driving method may comprise applying a low level signal to the control signal terminal at the starting point of the gate line scan signal outputted from the output terminal of the shift register processing circuit and applying a high level signal to the control signal terminal after a period to make the starting point of the final gate line scan signal outputted from the output terminal of the shift register later than the starting point of the gate line scan signal outputted from the output terminal of the shift register processing circuit. A timing of the final gate line scan signal may overlap with a timing of the gate line scan signal, and a time period of the final gate line scan signal may be shorter than that of the gate line scan signal. A timing of an effective control signal of the control signal terminal may overlap with a timing of the gate line scan signal, and a time period of the effective control signal may be shorter than that of the gate line scan signal.

Another example of the present disclosure is a driving method of the gate integrated driving circuit according to one embodiment of the present disclosure. The driving method may comprise applying a low level signal to a control signal terminal of an N th stage shift register after an N−1 stage shift register outputs a high level signal and applying a high level signal to the control signal terminal of the N th stage shift register after a period to make a starting point of a final gate line scan signal outputted from an output terminal of the N th stage shift register later than a starting point of a gate line scan signal outputted from an output terminal of an N th stage shift register processing circuit. There may be a certain time interval between final output signals from output terminals of two adjacent shift registers to a coupled gate line.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
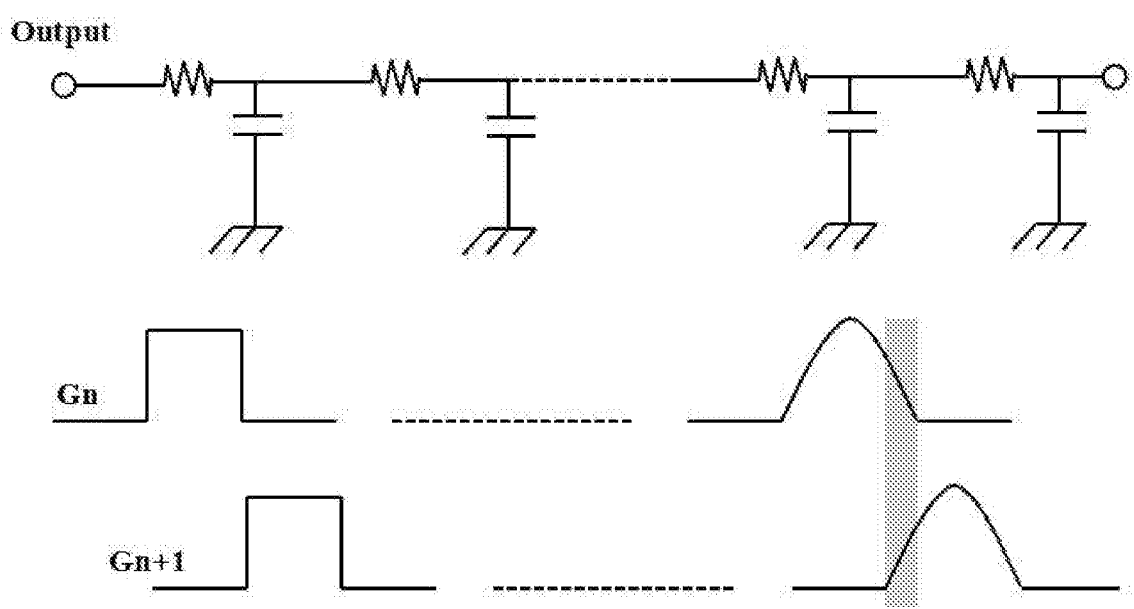
FIG. 1 shows a schematic diagram of a charging crosstalk of a gate line scanning signal outputted from a shift register output terminal in the conventional art.

The present invention is described with reference to embodiments of the invention. Throughout the description of the invention reference is made to FIGS. 1-7. When referring to the figures, like structures and elements shown throughout are indicated with like reference numerals.

Crosstalk usually occurs between adjacent gate lines with the large-size of display panel. This is because that the increasing size of the display panel makes the traces of gate line on the panel longer. When a gate signal is transmitted from a near end of an input terminal of a gate line to a far end, the gate signal may be influenced by gate line resistance and overlapping capacitance between a gate line and a source line. As such, the rising and falling edges of the gate signal received at the far end may have a period of time delay, as shown in FIG. 1. Accordingly, crosstalk phenomenon occurs between gate signals from adjacent gate lines, thereby resulting in distortion of the screen display.

Currently, in order to solve this problem, a method of bilateral drive is usually used, that is, GOA units are respectively provided at both ends of the gate line. Although the crosstalk phenomenon can be reduced by using two GOA units at both ends of the gate line together, the method of bilateral drive needs to double the number of GOA units. This in turn increases the size of the non-display area, which is a disadvantage for designing narrow borders, and at the same time, increases the cost as well.

Figure 2A:
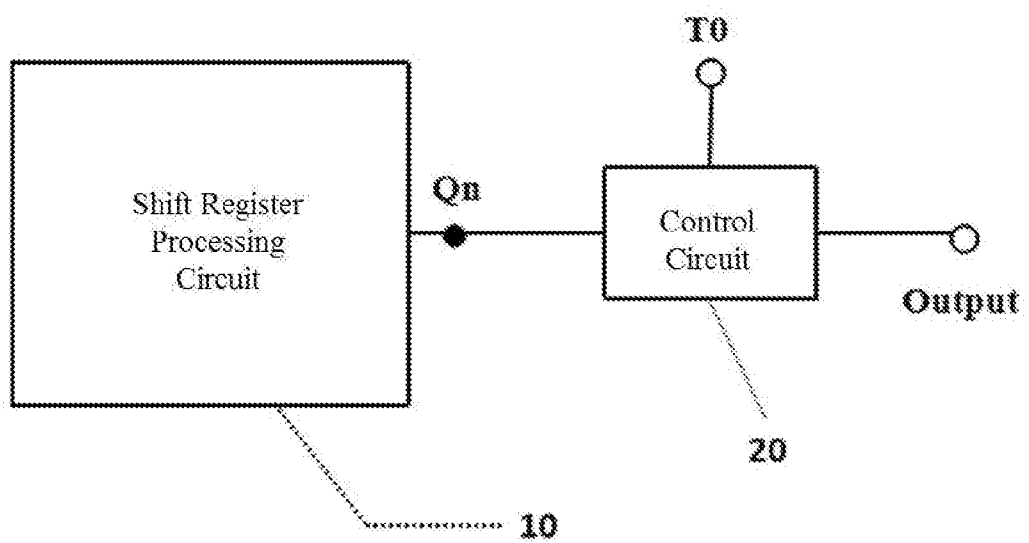
FIG. 2a shows a schematic diagram of a shift register in accordance with one embodiment.

FIG. 2a shows an example of a shift register in accordance with one embodiment of the present invention. The shift register may comprise a shift register processing circuit 10 and a control circuit 20. A first terminal of the control circuit 20 may be coupled to an output terminal Qn of the shift register processing circuit 10, a second terminal may be coupled to an output terminal of the shift register (Output), and a third terminal may be coupled to a control signal terminal T0. The control circuit 20 may be used for outputting a gate line scan signal from the output terminal Qn of the shift register processing circuit 10 to the output terminal Output of the shift register under a control of the control signal terminal T0. An effective control signal of the control signal terminal T0 may be later than the gate line scan signal.

In the shift register in accordance with one embodiment of the present invention, the control circuit 20 may be added between the output terminal Qn of the present shift register processing circuit 10 and the output terminal Output of the shift register. The timing of the effective control signal inputted from the control signal terminal T0 to the control circuit 20 may partially overlap with the timing of the gate line scan signal. Furthermore, the effective control signal may be later than the gate line scan signal outputted from the output terminal Qn of the shift register processing circuit 10. In one embodiment, when the gate line scan signal is a high level signal and the effective control signal is a high level signal, the rising edge of the effective control signal is later than the rising edge of the gate line scan signal outputted from the output terminal Qn of the shift register processing circuit 10, and the rising edge of the effective control signal is earlier than the falling edge of the gate line scan signal. When the effective control signal is a low level signal, the falling edge of the effective control signal is later than the rising edge of the gate line scan signal which is outputted from the output terminal Qn of the shift register processing circuit 10, and the falling edge of the effective control signal is earlier than the falling edge of the gate line scan signal. As a result, when an effective control signal is inputted to the control signal terminal T0, the control circuit 20 can control the output of the gate line scan signal from the output terminal Qn of the shift register processing circuit 10 to the output terminal Output of the shift register, so that the final output signal outputted from the output terminal Output of the shift register is later than the gate line scan signal. Accordingly, there is a certain time interval between the final output signals outputted to the coupled gate line from output terminals of two adjacent shift registers, so as to prevent signal crosstalk between adjacent rows of gate lines and reduce abnormal display problem of a LCD display caused by the crosstalk.

The time interval between the final output signals outputted from the output terminals Output of two adjacent shift registers may be determined by a Resistor-Capacity (RC) delay on the gate line generated by the signals based on the load of the gate line, i.e., the resistance of the gate line and the overlapping capacitance between the gate line and the source line. Specifically, the longer the RC delay is, the longer the effective control signal needs to be later than the gate line scan signal.

Figure 2B:
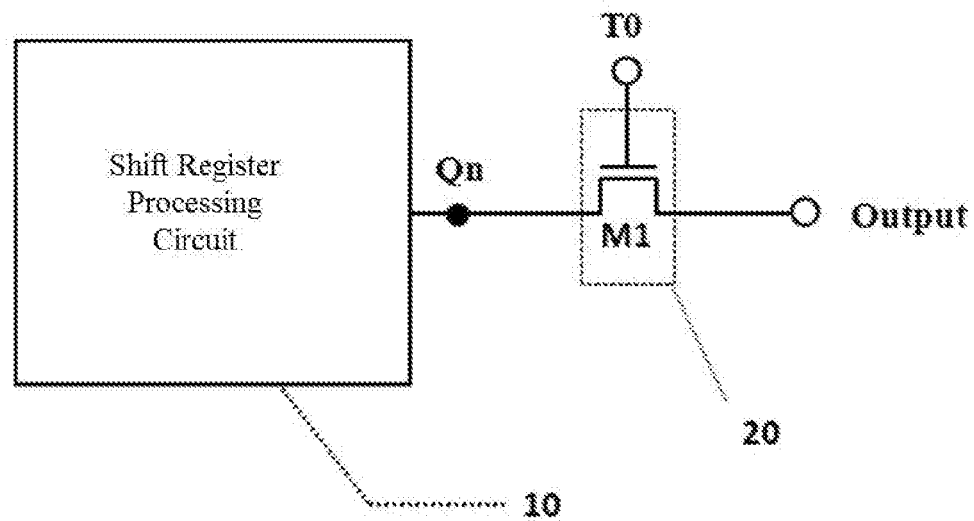
FIG. 2b shows a schematic block diagram of a control circuit in a shift register in accordance with one embodiment.

In one embodiment, as shown in FIG. 2b, the control circuit 20 may include a first thin film transistor M1. A gate of the first thin film transistor M1 may be coupled to the control signal terminal T0, a source of the first thin film transistor may be coupled to the output terminal Qn of the shift register processing circuit 10, and a drain of the first thin film transistor may be coupled to the output terminal Output of the shift register. Specifically, when an effective control signal is inputted to the control signal terminal T0, the first thin film transistor M1 is turned on so that the gate line scan signal outputted from the output terminal Qn of the shift register processing circuit 10 may be outputted to the output terminal Output of the shift register.

The first thin film transistor M1 may be a p-type thin film transistor or an n-type thin film transistor, as shown in FIG. 2b, and is not limited thereto. When the first thin film transistor M1 is a P-type thin film transistor, the effective control signal inputted to the control signal terminal T0 needs to be a low level signal; when the first thin film transistor M1 is an N-type thin film transistor, the effective control signal inputted to the control signal terminal T0 needs to be a high level signal.

The above is only an example of the specific configuration of the control circuit in accordance with one embodiment of the present invention. The specific configuration of the control circuit 20 is not limited to the above-described structure provided by the embodiments of the present disclosure and may be other structures known to those skilled in the art, which is not described herein.

Figure 3A:
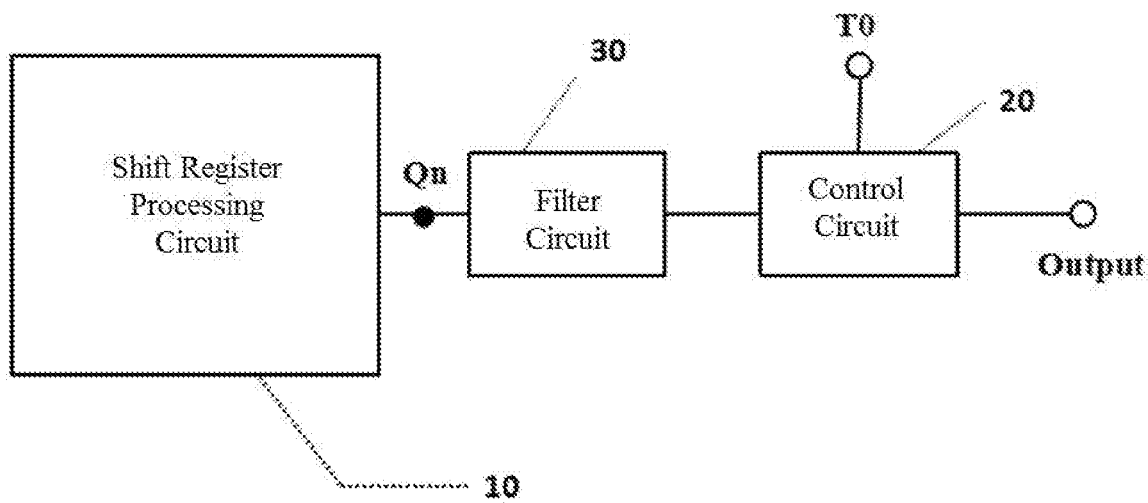
FIG. 3a shows a schematic diagram of a shift register in accordance with one embodiment.

In one embodiment, in order to reduce the noise interference at output terminal Output of the shift register, a shift register, as shown in FIG. 3a, may further include a filter circuit 30. The filter circuit 30 may be coupled between the output terminal Qn of the shift register processing circuit 10 and the first terminal of the control circuit 20. The filter circuit 30 may remove the noise in the gate line scan signal outputted from the output terminal Qn of the shift register processing circuit 10, and then output the gate line scan signal to the first terminal of the control circuit, and then the gate line scan signal whose noise has been removed is outputted to the output terminal Output of the shift register under a control of the control circuit 20.

Figure 3B:
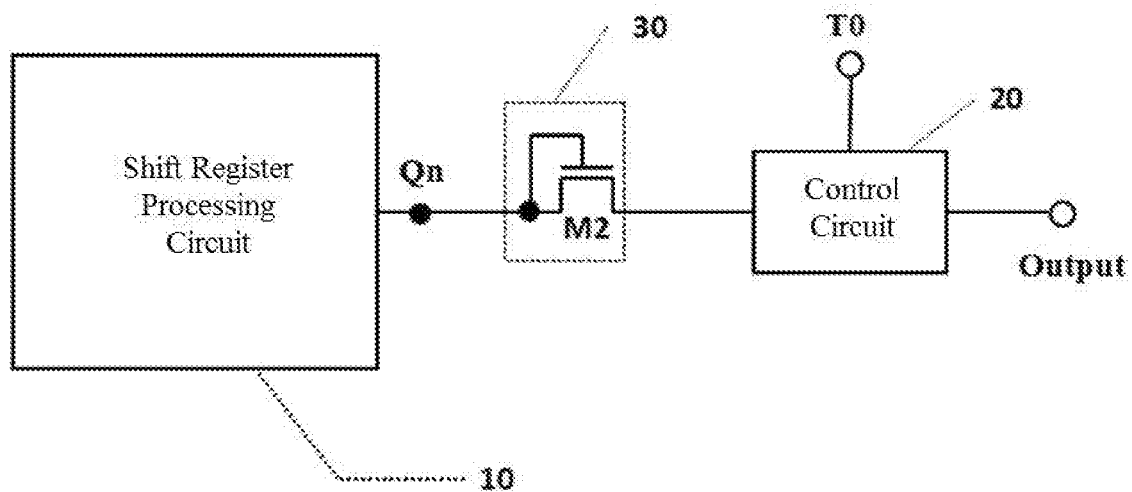
FIG. 3b shows a schematic block diagram of a filter circuit in a shift register in accordance with one embodiment.

In one embodiment, as shown in FIG. 3b, the filter circuit 30 may comprise a second thin film transistor M2. A gate and a source of the second thin film transistor M2 may be coupled to the output terminal Qn of the shift register processing circuit 10 respectively, and a drain of the second thin film transistor may be coupled to the first terminal of the control circuit 20. Specifically, under a control of the output terminal Qn of the shift register processing circuit 10, the second thin film transistor M2 may be turned on, and the gate line scan signal outputted from the output terminal Qn of the shift register processing circuit 10 may be denoised and transmitted to the first terminal of the control circuit 20.

The second thin film transistor M2 may be a p-type thin film transistor or an n-type thin film transistor, as shown in FIG. 3b, and is not limited thereto. When the second thin film transistor M2 is a p-type thin film transistor, it is necessary that the gate line scan signal outputted from the output terminal Qn of the shift register processing circuit 10 is a low level signal. When the second thin film transistor M2 is an N-type thin film transistor, it is necessary that the gate line scan signal outputted from the output terminal Qn of the shift register processing circuit 10 is a high level signal.

The above is only one example of the filter circuit 30. In the specific implementation, the specific configuration of the filtering circuit 30 is not limited to the above-described structure provided by the embodiments of the present invention, and other structures known to those skilled in the art may be used, which is not described herein.

Figure 4A:
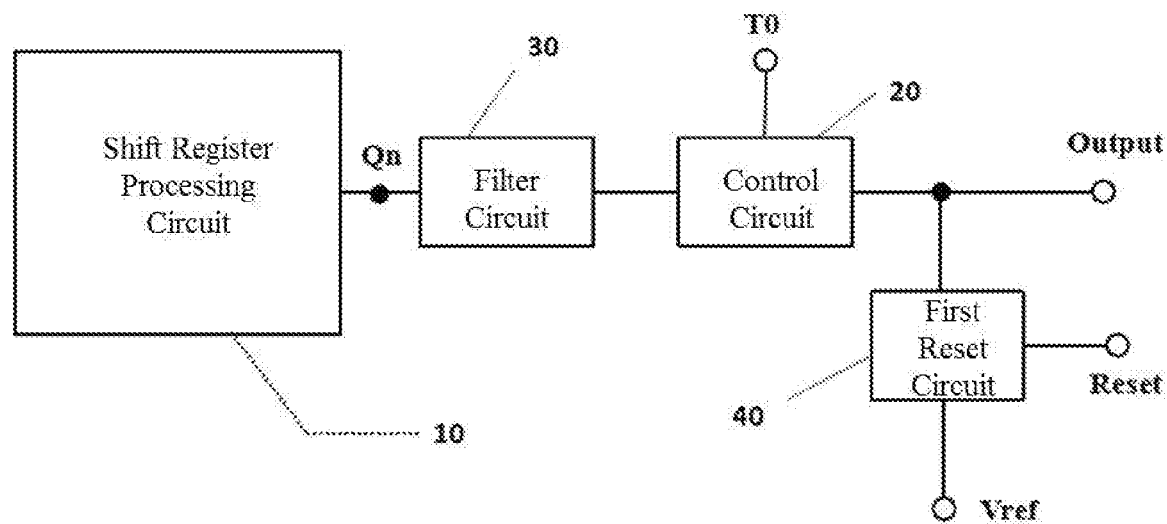
FIG. 4a shows a schematic diagram of a shift register provided in accordance with one embodiment.

In another embodiment, in order to reduce the noise during a period when no output signal is outputted from the output terminal Output of the shift register, as shown in FIG. 4a, the shift register may further include a first reset circuit

40. A first terminal of the first reset circuit 40 may be coupled to the output terminal Output of the shift register, a second terminal may be coupled to a reference signal terminal Vref, and a third terminal may be coupled to a reset signal terminal Reset. The reset signal terminal Reset may be coupled to the output terminal Qn+1 of the shift register processing circuit of the next stage shift register 10. The first reset circuit 40 may supply a reference signal of the reference signal terminal Vref to the output terminal Output of the shift register when a reset signal is inputted to the reset signal terminal Reset.

In one embodiment, when the gate line scan signal outputted from the output terminal Qn of the shift register processing circuit 10 is a low level signal, the reference signal terminal Vref is a high level signal terminal VDD. When the gate line scan signal outputted from the output terminal Qn of the shift register processing circuit 10 is a high level signal, the reference signal terminal Vref is a low level signal terminal Vref.

Figure 4B:
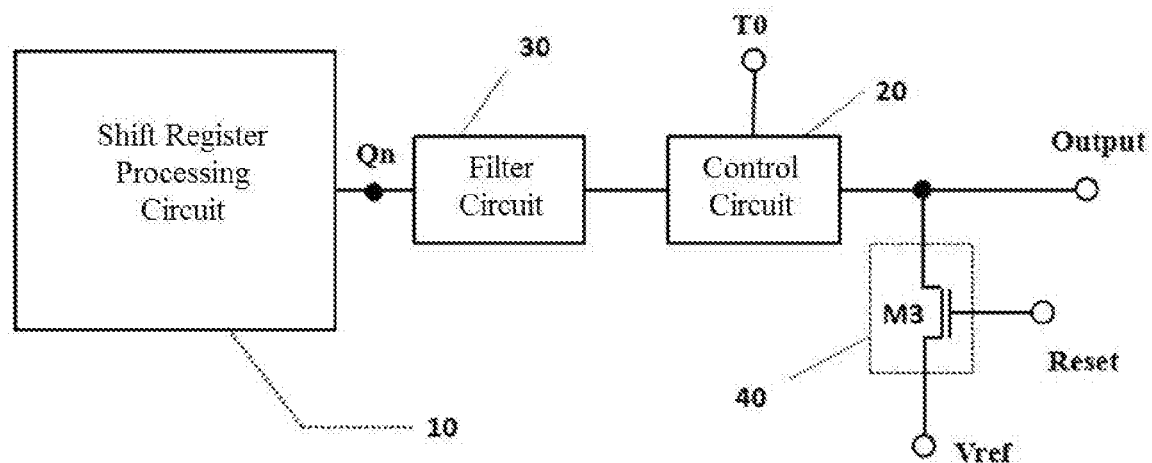
FIG. 4b shows a schematic diagram of a first reset circuit in a shift register in accordance with one embodiment.

In one embodiment, as shown in FIG. 4b, the first reset circuit 40 may include a third thin film transistor M3. A gate of the third thin film transistor M3 may be coupled to the reset signal terminal Reset, a source may be coupled to the reference signal terminal Vref, and a drain may be coupled to the output terminal Output of the shift register. Specifically, under a control of the reset signal terminal Reset, the third thin film transistor M3 may be turned on, and the reference signal of the reference signal terminal Vref may be outputted to the output terminal Output of the shift register.

The third thin film transistor M3 may be a p-type thin film transistor or an n-type thin film transistor, as shown in FIG. 4b, and is not limited thereto. When the third thin film transistor M3 is a P-type thin film transistor, the signal inputted to the reset signal terminal Reset needs to be a low level signal. When the third thin film transistor M3 is an N-type thin film transistor, the signal inputted to the reset signal terminal Reset needs to be a high level signal.

The above is only a specific example of the first reset circuit 40 in accordance with one embodiment of the present invention. The specific configuration of the first reset circuit 40 is merely exemplified above, in the specific implementation, the specific configuration of the first reset circuit 40 is not limited to the above-described structure provided by the embodiments of the present invention, and other structures known to those skilled in the art may be used, which is not described herein.

Furthermore, the shift register processing circuit 10 in the above-described shift register provided by the embodiments of the present invention may have various implementation structures, and is not exhaustive. The shift register processing circuit 10 in the shift register provided by one embodiment of the present invention will be described in detail with the structure shown in FIG. 5a as an example.

Figure 5A:
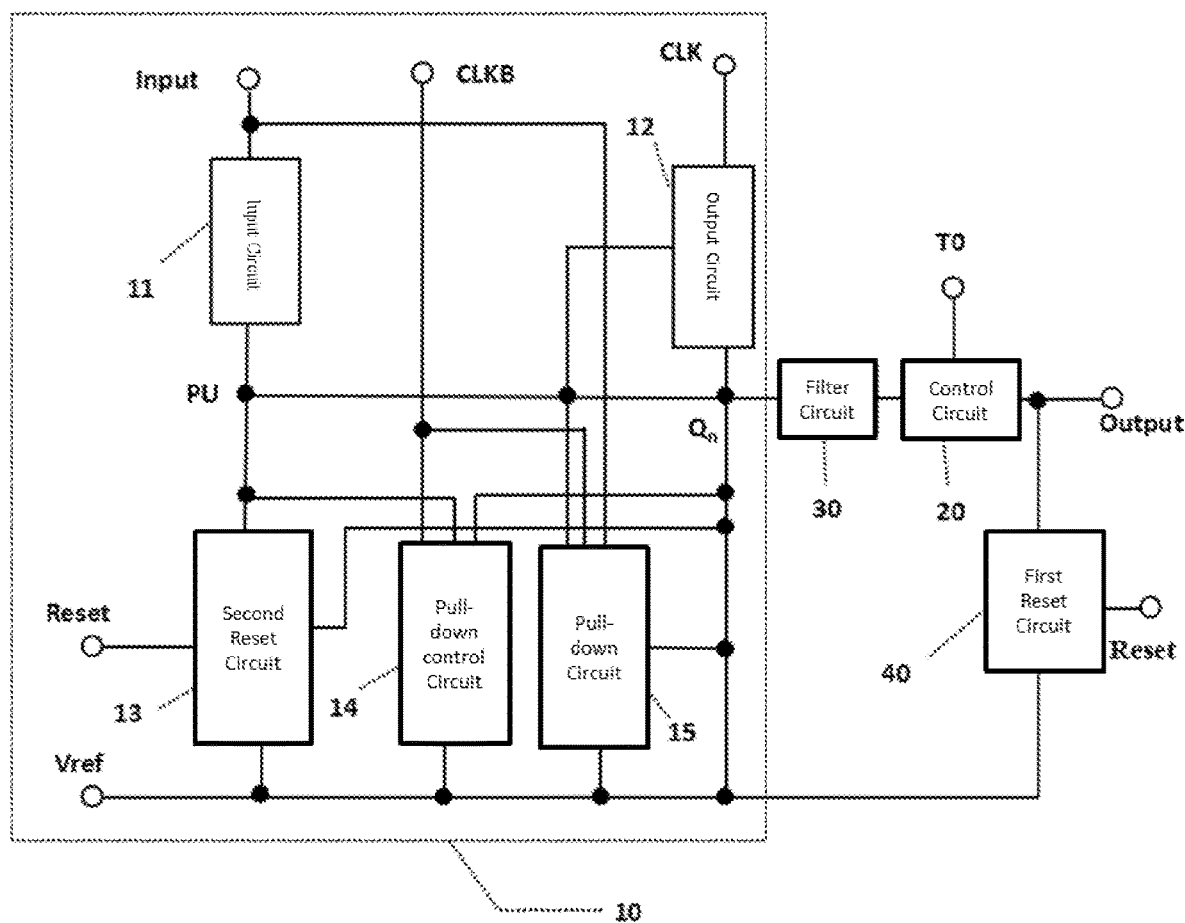
FIG. 5a shows a schematic diagram of a shift register provided in accordance with one embodiment.

In one embodiment, in the above-mentioned shift register provided by the embodiment of the present invention, as shown in FIG. 5a, the shift register processing circuit 10 may include: an input circuit 11, an output circuit 12, a second reset circuit 13, and a pull-down control circuit 14.

In one embodiment, a first terminal of the input circuit 11 may be coupled to a signal input terminal Input. A second terminal of the input circuit 11 may be coupled to a first node PU. The signal input terminal Input may be coupled to an output terminal Qn−1 of the shift register processing circuit 10 of a previous stage shift register. An input circuit 11 is used for controlling an electric potential of the first node PU to be the first electric potential when an effective pulse signal is inputted to the signal input terminal Input.

In one embodiment, a first terminal of the output circuit 12 may be coupled to a first clock signal terminal CLK. A second terminal of the output circuit 12 may be coupled to the first node PU. A third terminal of the output circuit 12 may be coupled to the output terminal Qn of the shift register processing circuit 10. The output circuit 12 may be used for supplying a clock signal of the first clock signal terminal CLK to the output terminal Qn of the shift register processing circuit 10 when the first node PU is at the first electric potential.

In one embodiment, a first terminal of the second reset circuit 13 may be coupled to the reference signal terminal Vref. A second terminal of the second reset circuit 13 may be coupled to the reset signal terminal Reset. A third terminal of the second reset circuit 13 may be coupled to the first node PU. A fourth terminal may be coupled to the output terminal Qn of the shift register processing circuit 10. The reset signal terminal Reset may be coupled to the output terminal Qn+1 of the shift register processing circuit 10 of the next stage shift register. The second reset circuit 13 may be used for supplying a reference signal of the reference signal terminal Vref to the first node PU and the output terminal Qn of the shift register processing circuit 10 when a reset signal is inputted to the reset signal terminal Reset.

In one embodiment, a first terminal of the pull-down control circuit 14 may be coupled to the second clock signal terminal CLKB. A second terminal of the pull-down control circuit 14 may be coupled to the reference signal terminal Vref. A third terminal of the pull-down control circuit 14 may be coupled to the first node PU. A fourth terminal of the pull-down control circuit 14 may be coupled to the signal output terminal Qn of the shift register processing circuit 10. The pull-down control circuit 14 may be used for supplying the reference signal of the reference signal terminal Vref to the first node PU and the output terminal Qn of the shift register processing circuit 10, respectively, when a clock signal is inputted to the second clock signal terminal CLKB.

In one embodiment, when the effective pulse signal and the clock signal are high-level signals, the reference signal is a low-level signal. When the effective pulse signal and the clock signal are low level signals, the reference signal is a high level signal. The first clock signal terminal CLK and the second clock signal terminal CLKB alternately input the clock signal.

Figure 5B:
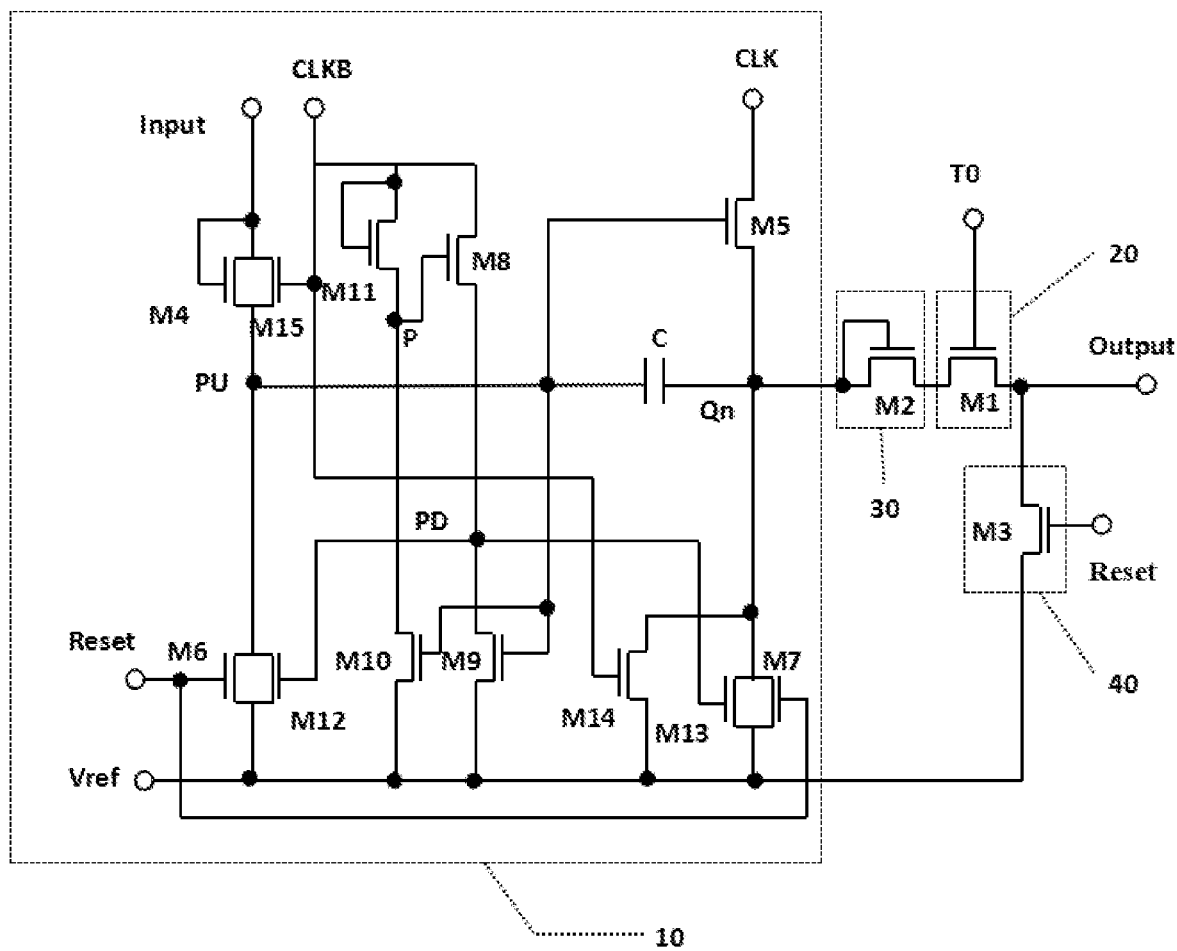
FIG. 5b shows a schematic diagram of a specific configuration of a shift register in accordance with one embodiment.

In one embodiment, in the above-mentioned shift register provided in the embodiment of the present invention, as shown in FIG. 5b, the input circuit 11 may include a fourth thin film transistor M4. A gate and a source of the fourth thin film transistor M4 may be coupled to the signal input terminal Input of the shift register processing circuit 10, and a drain of the fourth thin film transistor M4 may be coupled to the first node PU. Specifically, under a control of the signal input terminal Input of the shift register processing circuit 10, the fourth thin film transistor M4 may be turned on so that the effective pulse signal of the signal input terminal Input of the shift register processing circuit 10 may be outputted to the first node PU.

The fourth thin film transistor M4 may be a P-type transistor or an N-type transistor, as shown in FIG. 5b, and is not limited thereto.

The above is only a specific example of the structure of the input circuit 11, in the specific implementation, the specific configuration of the input circuit 11 is not limited to the above-described structure provided by the embodiments of the present invention, and other structures known to those skilled in the art may be used, which is not described herein.

In one embodiment, in the above-mentioned shift register provided in the embodiment of the present invention, as shown in FIG. 5b, the output circuit 12 may include a fifth thin film transistor M5 and a capacitor C. A gate of the fifth thin film transistor M5 may be coupled to the first node PU. A source of the fifth thin film transistor M5 may be coupled to the first clock signal terminal CLK. A drain of the fifth thin film transistor M5 may be coupled to the output terminal Qn of the shift register processing circuit 10.

The capacitor C may be coupled between the first node PU and the signal output terminal Qn of the shift register processing circuit 10.

The fifth thin film transistor M5 may be a p-type thin film transistor or an n-type thin film transistor, as shown in FIG. 5b, and is not limited thereto.

The above is only a specific example of the structure of the output circuit 12, in the specific implementation, the specific configuration of the output circuit 12 is not limited to the above-described structure provided by the embodiments of the present invention, and other structures known to those skilled in the art may be used, which is not described herein.

In one embodiment, in the above-mentioned shift register provided in the embodiment of the present invention, as shown in FIG. 5b, the second reset circuit 13 may include: a sixth thin film transistor M6, and a seventh thin film transistor M7.

In one embodiment, a gate of the sixth thin film transistor M6 may be coupled to the reset signal terminal Reset of the shift register processing circuit 10; a source may be coupled to the reference signal terminal Vref, and a drain may be coupled to the first node PU.

In one embodiment, a gate of the seventh thin film transistor M7 may be coupled to the reset signal terminal Reset of the shift register processing circuit 10, a source may be coupled to the reference signal terminal Vref, and a drain may be coupled to the signal output terminal Qn of the shift register processing circuit 10.

The sixth thin film transistor M6 and the seventh thin film transistor M7 each may be a P type thin film transistor or an N type thin film transistor, as shown in FIG. 5b, and are not limited thereto.

The above is only a specific example of the structure of the second reset circuit 13, in the specific implementation, the specific configuration of the second reset circuit 13 is not limited to the above-described structure provided by the embodiments of the present invention, and other structures known to those skilled in the art may be used, which is not described herein.

In one embodiment, as shown in FIG. 5b, the pull-down control circuit 14 may include: an eighth thin film transistor M8, a ninth thin film transistor M9, a tenth thin film transistor M10, an eleventh thin film transistor M11, a twelfth thin film transistor M12, and a thirteenth thin film transistor M13.

In one embodiment, a gate of the eighth thin film transistor M8 may be coupled to a third node P, a source of the eighth thin film transistor M8 may be coupled to a second clock signal terminal CLKB, and a drain of the eighth thin film transistor M8 may be coupled to a second node PD.

In one embodiment, a gate of the ninth thin film transistor M9 may be coupled to the first node PU, a source of the ninth thin film transistor M9 may be coupled to the reference signal terminal Vref, and a drain of the ninth thin film transistor M9 may be coupled to the second node PD.

In one embodiment, a gate of the tenth thin film transistor M10 may be coupled to the first node PU, a source of the tenth thin film transistor M10 may be coupled to the reference signal terminal Vref, and a drain of the tenth thin film transistor M10 may be coupled to the third node P.

In one embodiment, a gate and a source of the eleventh thin film transistor M11 may be coupled to the second clock signal terminal CLKB and a drain may be coupled to the third node P.

In one embodiment, a gate of the twelfth thin film transistor M12 may be coupled to the second node PD, a source may be coupled to the reference signal terminal Vref, and a drain may be coupled to the first node PU.

In one embodiment, a gate of the thirteenth thin film transistor M13 may be coupled to the second node PD, a source may be coupled to the reference signal terminal Vref, and a drain may be coupled to the signal output terminal Qn of the shift register processing circuit 10.

In the specific implementation, each of the eighth thin film transistor M8, the ninth thin film transistor M9, the tenth thin film transistor M10, the eleventh thin film transistor M11, the twelfth thin film transistor M12, and the thirteenth thin film transistor M13 may be a P type thin film transistor or an N type thin film transistor, as shown in FIG. 5b, and are not limited thereto.

The above is only a specific example of the structure of the pull-down control circuit 14. In the specific implementation, the specific configuration of the pull-down control circuit 14 is not limited to the above-described structure provided by the embodiments of the present invention, and other structures known to those skilled in the art may be used, which is not described herein.

In one embodiment, in the above-mentioned shift register provided by the embodiment of the present invention, as shown in FIG. 5a, the shift register processing circuit may further include a pull-down circuit 15. A first terminal of the pull-down circuit 15 may be coupled to a second clock signal terminal CLKB, a second terminal may be coupled to the first node PU, a third terminal may be coupled to the signal input terminal Input, a fourth terminal may be coupled to the reference signal terminal Vref, and a fifth terminal may be coupled to the output terminal Qn of the shift register processing circuit 10. The pull-down circuit 15 is used for supplying the reference signal of the reference signal terminal Vref to the output terminal Qn of the shift register processing circuit 10, and turn on the signal input terminal Input and the first node PU when a clock signal is inputted to the second clock signal terminal CLKB.

In one embodiment, in the above-mentioned shift register provided in the embodiment of the present invention, as shown in FIG. 5b, the pull-down circuit 15 may include a fourteenth thin film transistor M14 and a fifteenth thin film transistor M15.

In one embodiment, a gate of the fourteenth thin film transistor M14 may be coupled to the second clock signal terminal CLKB, a source of the fourteenth thin film transistor M14 may be coupled to the reference signal terminal Vref, and a drain of the fourteenth thin film transistor M14 may be coupled to the signal output terminal Qn of the shift register processing circuit 10.

In one embodiment, a gate of the fifteenth thin film transistor M15 may be coupled to the second clock signal terminal CLKB, a source of the fifteenth thin film transistor M15 may be coupled to the signal input terminal Input of the shift register processing circuit 10, and a drain of the fifteenth thin film transistor M15 may be coupled to the first node PU.

The fourteenth thin film transistor M14 and the fifteenth thin film transistor M15 each may be a P-type thin film transistor or an N-type thin film transistor, as shown in FIG. 5b, and are not limited thereto.

The above is only a specific example of the structure of the pull-down circuit 15. In the specific implementation, the specific configuration of the pull-down circuit 15 is not limited to the above-described structure provided by the embodiments of the present invention, and other structures known to those skilled in the art may be used, which is not described herein.

The operation of the shift register in accordance with one embodiment of the present invention will be described with reference to the shift register shown in FIG. 5b and the input-output timing diagram shown in FIG. 6.

Figure 6:
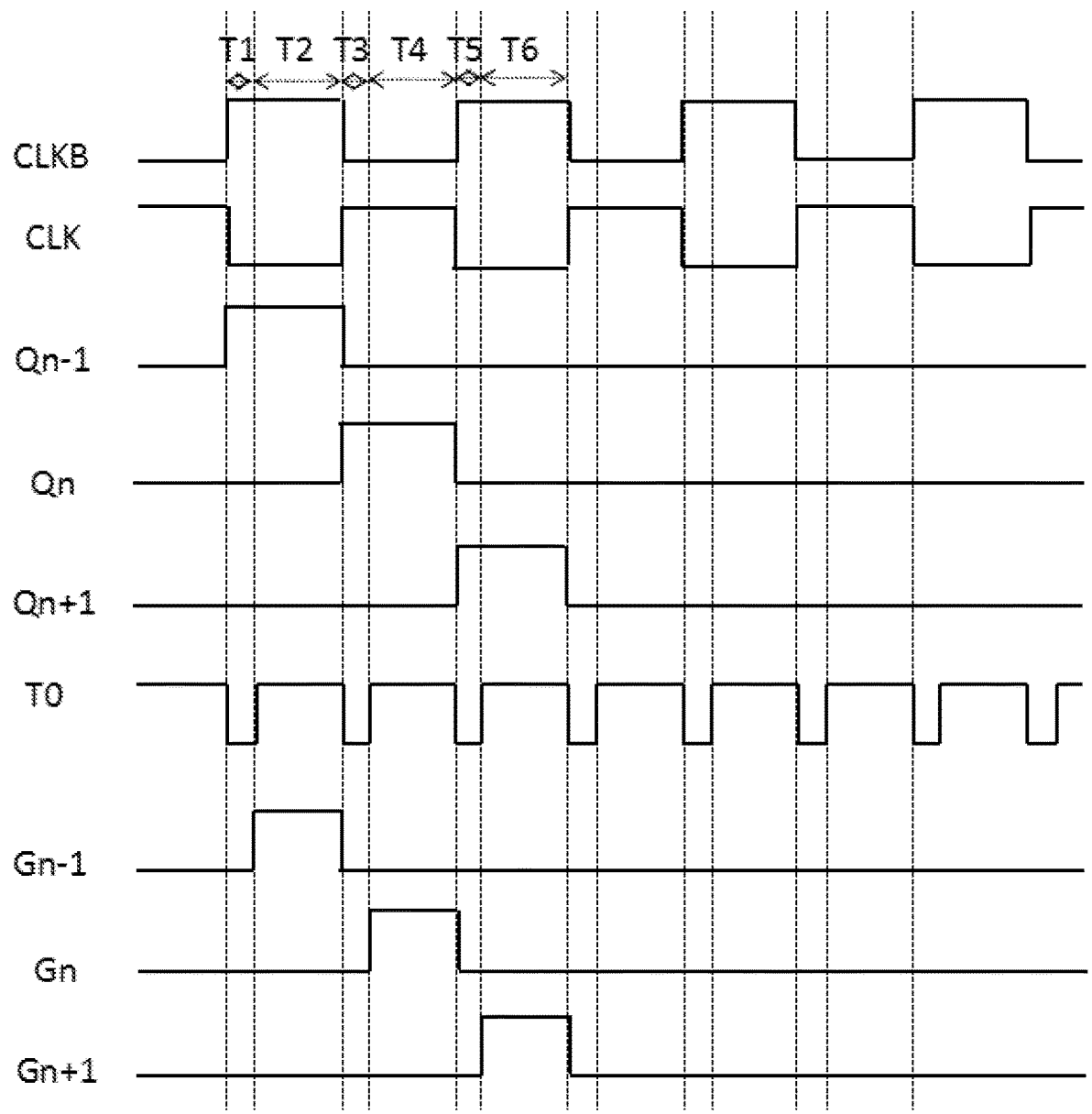
FIG. 6 shows an input-output timing chart of a shift register in accordance with one embodiment.

As shown in FIG. 6, in the input-output timing chart of the shift register in accordance with one embodiment of the present invention, T1-T6 six stages are selected. In the following description, a high-level signal is indicated by "1," and a low-level signal is indicated by "0."

At T1 stage, Input (Qn−1)=1, CLK=0, CLKB=1, Reset (Qn+1)=0, T0=0. Since Input=1, the fourth thin film transistor M4 is turned on and controls the shift register to start operation. The signal input terminal INPUT of the shift register processing circuit 10 pulls up the first node PU to a high level and charges the capacitor C through the fourth thin film transistor M4. Since the CLKB=1, the eleventh thin film transistor M11, the fourteenth thin film transistor M14, and the fifteenth thin film transistor M15 are turned on, the eighth thin film transistor M8 is also turned on and the second node PD is pulled up to a high level, the fourteenth thin film transistor M14 is turned on to pull down the signal output terminal Qn of the shift register processing circuit 10 to the reference signal Vref. Since the first node PU is pulled up to a high level, the ninth thin film transistor M9 is turned on to pull down the second node PD the reference signal Vref. When the second node PD is at the high level, the twelfth thin film transistor M12 and the thirteenth thin film transistor M13 are turned on, and the signal output terminal Qn of the shift register processing circuit 10 is pulled down to the reference signal Vref. At the same time, since the first node PU is at the high level, the fifth thin film transistor M5 is turned on, and also because CLK=0, the signal output terminal Qn of the shift register processing circuit 10 is pulled down to the low level. Then, since the signal output terminal Qn of the shift register processing circuit 10 is at the low level, the second thin film transistor M2 is turned off, and the signal output terminal of the shift register outputs a low level.

At T2 stage, Input=1, CLK=0, CLKB=1, Reset=0, T0=1. According to the result of the T1 stage, when T0=1, the signal output terminal Qn of the shift register processing circuit 10 is at a low level, so that the second thin film transistor M2 is turned off. As a result, the signal output terminal Output of the shift register still outputs a low level. The T1~T2 stage is a charging stage of the capacitor C in the shift register.

At T3 stage, Input=0, CLK=1, CLKB=0, Reset=0, T0=0. Since Input=0, the fourth thin film transistor M4 is turned off, and the bootstrap action of the capacitor C further pulls up the first node PU. Since CLKB=0, the eleventh thin film transistor M11, the fourteenth thin film transistor M14, and the fifteenth thin film transistor M15 are all turned off. Furthermore, the ninth thin film transistor M9 and the tenth thin film transistor M10 are turned on when the first node PU is pulled high, and the second node PD is pulled down to the reference signal Vref. Accordingly, the second node PD remains at a low level. Since CLK=1, and the fifth thin film transistor M5 is turned on due to the first node PU being pulled high, the high level on the first clock signal terminal CLK is outputted to the signal output terminal Qn of the shift register processing circuit 10, so that the second thin film transistor M2 is turned on. However, since T0=0, the first thin film transistor M1 is turned off, and the signal output terminal of the shift register outputs a low level. So T3 stage is a control stage.

At T4 stage, Input=0, CLK=1, CLKB=0, Reset=0, T0=1. According to the result of the T3 stage, when T0=1, the first thin film transistor M1 is turned on, the high level of the signal output terminal Qn of the shift register processing circuit 10 is outputted to the signal output terminal Output of the shift register. Furthermore, all the thin film transistors located on the n-th gate line in the display region of the liquid crystal panel are turned on through the n-th gate line corresponding to the shift register, and the data line begins to write the signal. So T4 stage is an open stage of the shift register.

At T5 stage, Input=0, CLK=0, CLKB=1, Reset=1, T0=0. Since CLKB=1, the eleventh thin film transistor M11, the fourteenth thin film transistor M14, and the fifteenth thin film transistor M15 are turned on, and the eighth thin film transistor M8 is turned on, the second node PD is pulled up to a high level, the fourteenth thin film transistor M14 is turned on to pull down the output terminal Qn of the shift register processing circuit 10 to the reference signal Vref. Since the second node PD is pulled up to the high level, the twelfth thin film transistor M12 and the thirteenth thin film transistor M13 are turned on, pulling down the first node PU to the reference signal Vref as well as the output terminal Qn of the shift register processing circuit 10 to the reference signal Vref. Since the first node PU is at a low level, the fifth thin film transistor M5 is turned off. At this time, since the output terminal Qn of the shift register processing circuit 10 outputs the low level, the second thin film transistor M2 is turned off, and since T0=0, the first thin film transistor M1 is turned off. However, since the third terminal of the first reset circuit 40, which is the control terminal, is coupled to the reset signal terminal Reset, and the reset signal terminal Reset is coupled to the output terminal Qn of the shift register processing circuit 10 of the next stage shift register, the third thin film transistor M3 is turned on and the reference signal Vref at the reference signal terminal is outputted to the output terminal Output of the shift register so that the output terminal Output of the shift register outputs a low level. All the thin-film transistors on the n-th gate line are turned off. In short, since each of the twelfth thin film transistor M12, the thirteenth thin film transistor M13, and the fourteenth thin film transistor M14 can enable the output terminal Qn of the shift register processing circuit 10 to output a low level, therefore, when any one of the three thin film transistors is damaged, another one can still hold the output terminal Qn of the shift register processing circuit 10 to output a low level, which plays a role as a triple insurance, and thereby advantageously preventing the output terminal Output of the shift register from being influenced by other interference signals. At the same time, through the opening and closing of the control circuit 20, the signal outputted from the output terminal Qn of the shift register processing circuit can be effectively transmitted with an interval between adjacent gate lines, thereby realizing a delayed output.

At T6 stage, Input=0, CLK=0, CLKB=1, Reset=1, T0=1. According to the result of the T5 stage, when other conditions are unchanged and only the control signal terminal T0 rises to the high level, the first thin film transistor M1 is turned on. But because Input=0, CLK=0, CLKB=1, Reset=1, the output terminal Qn of the shift register processing circuit 10 outputs a low level, the second thin film transistor M2 is still turned off, and because the third thin film transistor M3 is turned on, the output terminal Output of the shift register still outputs a low level, and all the thin-film transistors on the n-th gate line are kept off.

Thereafter until the next T3 and T4 stages, that is, Input=0, CLK=1, CLKB=0 Reset=0, T0=0 and T0=1, the shift register outputs first a low level and then a high level, so that there is a time difference between the timing of turn-on of the TFTs coupled to the adjacent row gate lines. That is, at T0=0 stage, TFT is turned off until T0=1 when TFT is opened. Therefore, under a control of the control circuit 20, the n-th row is turned on whereas the n−1th row is completely in a closed state, thereby achieving the delayed output between adjacent row lines and preventing the crosstalk phenomenon.

The above explanation has been made only by the shift register shown in FIG. 5b. However, the shift register provided by the embodiments of the present invention is not limited thereto.

Figure 7:
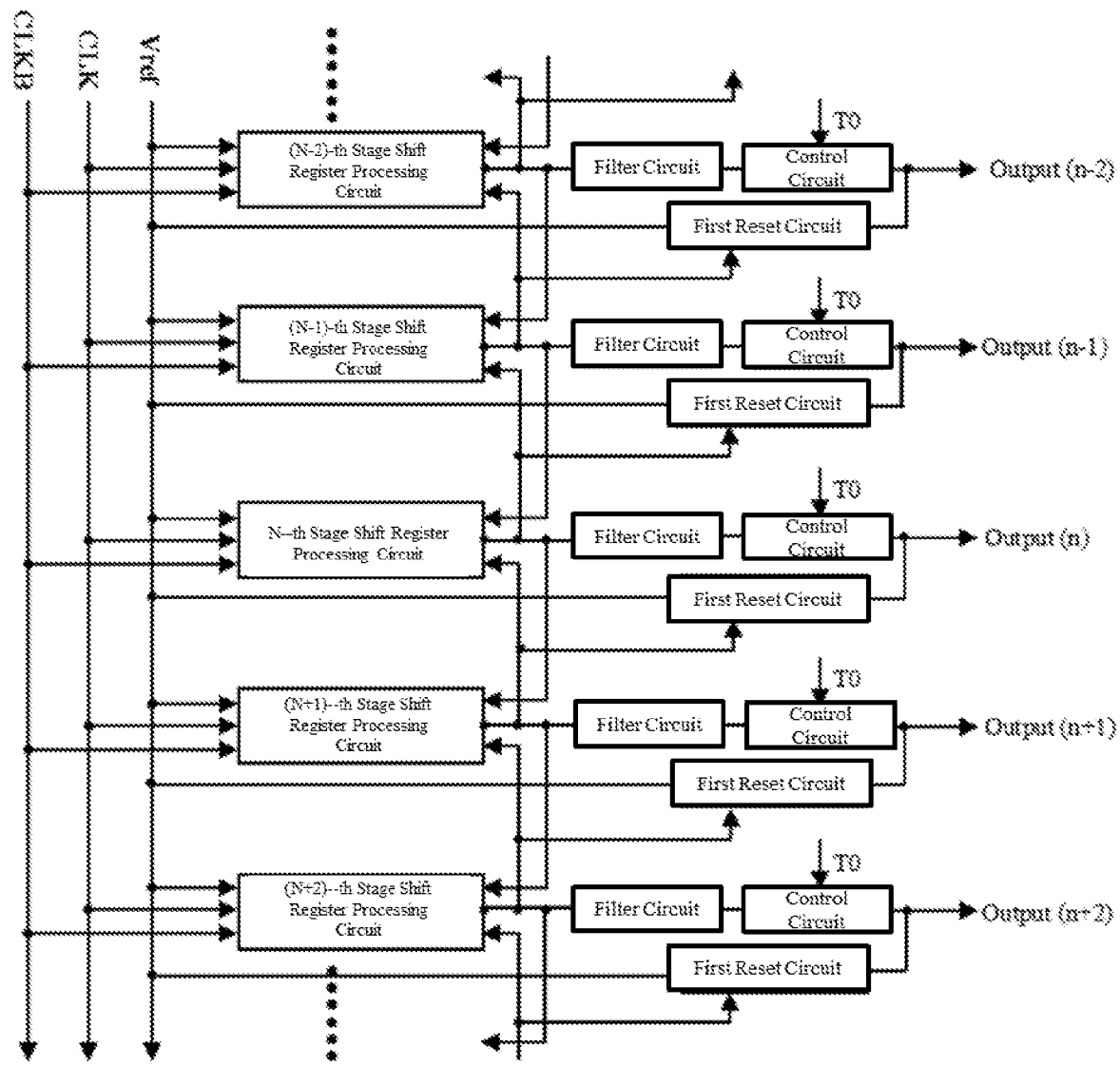
FIG. 7 shows a schematic diagram of a gate integrated driving circuit in accordance with one embodiment.

Another example of the present invention is a gate integrated driving circuit, as shown in FIG. 7. The gate integrated driving circuit may include a plurality of cascaded shift registers. In one embodiment, except the first stage shift register and the last stage shift register, the output terminal Qn of the shift register processing circuit 10 in each of the remaining shift registers may input an effective pulse signal to the signal input terminal Input of the next stage shift register, and input a reset signal Reset to the reset signal terminal of the previous stage shift register.

The output terminal of the shift register processing circuit in the first stage shift register may input an effective pulse signal to the input terminal of the second stage shift register.

The output terminal of the shift register processing circuit in the final stage shift register may input a reset signal to the reset signal terminal of the previous stage shift register.

For convenience of illustration, only five shift registers are shown in FIG. 7, which are the N−2 stage shift register, the N−1 stage shift register, the N th stage shift register, the N+1 th stage shift register, and the N+2 th stage shift register. The signal output terminal Qn of the Nth stage shift register processing circuit 10 not only inputs an effective pulse signal to the signal input terminal Input of the N+1th stage shift register, and also inputs a reset signal to the reset signal terminal Reset of the N−1th stage shift register.

In general, a frame start signal is inputted into the signal input terminal of the first shift register. In one embodiment, when the first clock signal of the system is inputted into the clock signal terminal of the odd-numbered shift register, the pull-down signal terminal is inputted with the second clock signal of the system. When the second clock signal of the system is inputted into the clock signal terminal of the even-numbered shift register, the pull-down signal terminal is inputted with the first clock signal of the system. The first clock signal and the second clock signal are periodically alternated.

In one embodiment, in terms of functionality and structure, the specific configuration of each shift register in the gate integrated driving circuit mentioned above may be the same as that of the shift register of the present invention mentioned above, and the repetition is not repeated.

Another example of the present invention is a display device, including the gate integrated driving circuit described above. Specific embodiments can be found in the above description of the gate integrated driving circuit, and the similarity of which is omitted herein.

Embodiments of the present invention may include a shift register, a gate integrated driving circuit, and a display device. Because a control circuit is added between the signal output terminal of the present shift register processing circuit and the signal output terminal of the shift register, when an effective control signal is inputted to the control signal terminal, the timing of the effective control signal overlaps with the timing of the gate line scanning signal, the control circuit may control the output of the gate line scan signal from the output terminal of the shift register processing circuit to the output terminal of the shift register, so that the final signal outputted from the output terminal of the shift register is later than the gate line scan signal, to ensure that there is a certain time interval between the final output signals from output terminals of two adjacent shift registers to the coupled gate line, so as to avoid the phenomenon of signal crosstalk between adjacent rows of gate lines and reduce the abnormal display problem of a LCD display caused by the crosstalk.

It will be apparent to those skilled in the art that various changes and modifications can be made in the present invention without departing from the spirit and scope of the present invention. Thus, it is intended that the present invention encompasses such modifications and variations if they come within the scope of the appended claims or the equivalents thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A shift register comprising:
   a shift register processing circuit,
   a control circuit, and
   a first reset circuit,
   wherein a first terminal of the control circuit is coupled to an output terminal of the shift register processing circuit, a second terminal of the control circuit is coupled to an output terminal of the shift register, and a third terminal of the control circuit is coupled to a control signal terminal,
   wherein the shift register is configured to output a final gate line scan signal from the output terminal of the shift register and a starting point of the final gate line scan signal is later than a starting point of a gate line scan signal outputted from the output terminal of the shift register processing circuit,
   wherein a first terminal of the first reset circuit is directly coupled to the output terminal of the shift register, a second terminal of the first rest circuit is coupled to a reference signal terminal, a third terminal of the first reset circuit is coupled to a reset signal terminal, the reset signal terminal is coupled to an output terminal of a shift register processing circuit of a next stage shift register; and
   wherein the first reset circuit is configured to supply a reference signal of the reference signal terminal to the output terminal of the shift register when a reset signal is inputted to the reset signal terminal.

2. The shift register according to claim 1, wherein the control circuit is configured to output the gate line scan signal outputted from the output terminal of the shift register processing circuit to the output terminal of the shift register under a control of the control signal terminal.

3. The shift register according to claim 1, wherein a timing of the final gate line scan signal overlaps with a timing of the gate line scan signal, and a time period of the final gate line scan signal is shorter than that of the gate line scan signal.

4. The shift register according to claim 1, wherein a timing of an effective control signal of the control signal terminal overlaps with a timing of the gate line scan signal, and a time period of the effective control signal is shorter than that of the gate line scan signal.

5. The shift register according to claim 1, wherein the control circuit comprises a first thin film transistor,
wherein a gate of the first thin film transistor is coupled to the control signal terminal, a source of the first thin film transistor is coupled to the output terminal of the shift register processing circuit, and a drain of the first thin film transistor is coupled to the output terminal of the shift register.

6. The shift register according to claim 1, further comprising a filter circuit,
wherein the filter circuit is coupled between the output terminal of the shift register processing circuit and the first terminal of the control circuit, and
the filter circuit is configured to eliminate noise in the gate line scanning signal outputted from the output terminal of the shift register processing circuit, and then output the gate line scanning signal to the first terminal of the control circuit.

7. The shift register according to claim 6, wherein the filter circuit comprises a second thin film transistor;
wherein a gate and a source of the second thin film transistor are coupled to the output terminal of the shift register processing circuit respectively, and a drain of the second thin film transistor is coupled to the first terminal of the control circuit.

8. The shift register according to claim 1, wherein the first reset circuit comprises a third thin film transistor, wherein a gate of the third thin film transistor is coupled to the reset signal terminal, a source of the third thin film transistor is coupled to the reference signal terminal, and a drain of the third thin film transistor is coupled to the output terminal of the shift register.

9. The shift register according to claim 1, wherein the shift register processing circuit comprises an input circuit, an output circuit, a second reset circuit and a pull-down control circuit;
wherein a first terminal of the input circuit is coupled to a signal input terminal, a second terminal of the input circuit is coupled to a first node, the signal input terminal is coupled to an output terminal of a shift register processing circuit of a previous stage shift register; and the input circuit is configured to control an electric potential of the first node to be a first electric potential when an effective pulse signal is inputted to the signal input terminal;
wherein a first terminal of the output circuit is coupled to a first clock signal terminal, a second terminal of the output circuit is coupled to the first node, a third terminal of the output circuit is coupled to the output terminal of the shift register processing circuit; and the output circuit is configured to supply a clock signal of the first clock signal terminal to the output terminal of the shift register processing circuit when the first node is at the first electric potential;
wherein a first terminal of the second reset circuit is coupled with the reference signal terminal, a second terminal of the second reset circuit is coupled to the reset signal terminal, a third terminal of the second reset circuit is coupled to the first node, a fourth terminal of the second reset circuit is coupled to the output terminal of the shift register processing circuit, the reset signal terminal is coupled to the output terminal of the shift register processing circuit of the next stage shift register; and the second reset circuit is configured to supply the reference signal of the reference signal terminal to the first node and the output terminal of the shift register processing circuit when the reset signal is inputted to the reset signal terminal; and
wherein a first terminal of the pull-down control circuit is coupled to a second clock signal terminal, a second terminal of the pull-down control circuit is coupled to the reference signal terminal, a third terminal of the pull-down control circuit is coupled to the first node, a fourth terminal of the pull-down control circuit is coupled to the output terminal of the shift register processing circuit; and the pull-down control circuit is configured to provide the reference signal of the reference signal terminal to the first node and the output terminal of the shift register processing circuit when a clock signal is inputted to the second clock signal terminal.

10. The shift register according to claim 9, wherein the shift register processing circuit further comprises a pull-down circuit,
wherein a first terminal of the pull-down circuit is coupled to the second clock signal terminal, a second terminal of the pull-down circuit is coupled to the first node, a third terminal of the pull-down circuit is coupled to the signal input terminal, a fourth terminal of the pull-down circuit is coupled to the reference signal terminal, a fifth terminal of the pull-down circuit is coupled to the output terminal of the shift register processing circuit; and the pull-down circuit is configured to supply the reference signal of the reference signal terminal to the output terminal of the shift register processing circuit and turn on the signal input terminal and the first node when the clock signal is inputted to the second clock signal terminal.

11. A gate integrated driving circuit, comprising:
a plurality of shift registers comprising the shift register according to claim 1.

12. The gate integrated driving circuit according to claim 11, wherein there is a certain time interval between final output signals from output terminals of two adjacent shift registers to a coupled gate line.

13. A display device comprising the gate integrated driving circuit of claim 12.

14. A driving method of the gate integrated driving circuit of claim 11, the driving method comprising:
applying a low level signal to a control signal terminal of an N th stage shift register after an N−1 stage shift register outputs a high level signal; and
applying a high level signal to the control signal terminal of the N th stage shift register after a period to make a starting point of a final gate line scan signal outputted from an output terminal of the N th stage shift register later than a starting point of a gate line scan signal outputted from an output terminal of an N th stage shift register processing circuit.

15. The driving method of the gate integrated circuit of claim 14,
wherein there is a certain time interval between final output signals from output terminals of two adjacent shift registers to a coupled gate line.

16. A driving method of the shift register of claim 1, the driving method comprising:
applying a low level signal to the control signal terminal at the starting point of the gate line scan signal outputted from the output terminal of the shift register processing circuit; and
applying a high level signal to the control signal terminal after a period to make the starting point of the final gate line scan signal outputted from the output terminal of the shift register later than the starting point of the gate line scan signal outputted from the output terminal of the shift register processing circuit.

17. The driving method according to claim 16, wherein a timing of the final gate line scan signal overlaps with a timing of the gate line scan signal, and a time period of the final gate line scan signal is shorter than that of the gate line scan signal.

18. The driving method according to claim 16, wherein a timing of an effective control signal of the control signal terminal overlaps with a timing of the gate line scan signal, and a time period of the effective control signal is shorter than that of the gate line scan signal.

* * * * *